(12) United States Patent
Liu et al.

(10) Patent No.: US 10,304,770 B2
(45) Date of Patent: May 28, 2019

(54) SEMICONDUCTOR DEVICE WITH STACKED TERMINALS

(71) Applicant: Tesla, Inc., Palo Alto, CA (US)

(72) Inventors: Wenjun Liu, Santa Clara, CA (US); Robert James Ramm, Mountain View, CA (US); Colin Kenneth Campbell, San Francisco, CA (US)

(73) Assignee: Tesla, Inc., Palo Alto, CA (US)

( * ) Notice: Subject to any disclaimer, the term of this patent is extended or adjusted under 35 U.S.C. 154(b) by 10 days.

(21) Appl. No.: 15/890,482

(22) Filed: Feb. 7, 2018

(65) Prior Publication Data

US 2018/0166377 A1  Jun. 14, 2018

Related U.S. Application Data

(63) Continuation of application No. 15/274,734, filed on Sep. 23, 2016, now abandoned.

(Continued)

(51) Int. Cl.

| | |
|---|---|
| *H01L 21/44* | (2006.01) |
| *H01L 23/02* | (2006.01) |
| *H01L 23/495* | (2006.01) |
| *H01L 21/78* | (2006.01) |
| *H01L 23/48* | (2006.01) |

(Continued)

(52) U.S. Cl.
CPC .............. *H01L 23/50* (2013.01); *H01G 4/12* (2013.01); *H01L 21/4825* (2013.01); *H01L 23/057* (2013.01); *H01L 23/3735* (2013.01); *H01L 28/40* (2013.01); *H01L 24/29* (2013.01); *H01L 24/32* (2013.01); *H01L 25/072* (2013.01); *H01L 2224/291* (2013.01); *H01L 2224/32245* (2013.01); *H01L 2224/37099* (2013.01); *H01L 2224/37599* (2013.01); *H01L 2224/40* (2013.01); *H01L 2924/00014* (2013.01);

(Continued)

(58) Field of Classification Search
CPC ........... H01L 23/3107; H01L 23/49568; H01L 23/49575; H01L 25/115; H01L 24/33
See application file for complete search history.

(56) References Cited

U.S. PATENT DOCUMENTS 6,414,379 B1 * 7/2002 Chang ................... H01L 21/565
257/666
2009/0194869 A1  8/2009 Eom (Continued)

*Primary Examiner* — Brian Turner
(74) *Attorney, Agent, or Firm* — Garlick & Markison; Bruce Garlick

(57) ABSTRACT

A semiconductor device includes housing, a substrate, a first semiconductor die, a second semiconductor die, a first terminal, and a second terminal. The first terminal in a first terminal plane couples to the first semiconductor die. The second terminal has a contact portion in a contact portion plane within the housing that couples to the second semiconductor die, a main portion in a main portion plane partially within the housing, the main portion plane substantially parallel to and offset from the first terminal plane, and the main portion plane substantially parallel to and offset from the contact portion plane, and an offsetting portion within the housing and that connects the contact portion to the main portion. At least some of the main portion of the second terminal overlaps the first terminal and the first terminal and the main portion of the second terminal extend from the housing in a same direction.

11 Claims, 4 Drawing Sheets

Related U.S. Application Data

(60) Provisional application No. 62/233,178, filed on Sep. 25, 2015.

(51) Int. Cl.
    *H01L 23/52*     (2006.01)
    *H01L 23/50*     (2006.01)
    *H01L 23/373*     (2006.01)
    *H01L 49/02*     (2006.01)
    *H01L 21/48*     (2006.01)
    *H01G 4/12*     (2006.01)
    *H01L 23/057*     (2006.01)
    *H01L 23/00*     (2006.01)
    *H01L 25/07*     (2006.01)

(52) U.S. Cl.
    CPC ............... *H01L 2924/10253* (2013.01); *H01L 2924/13055* (2013.01)

(56) References Cited

U.S. PATENT DOCUMENTS

| | | |
|---|---|---|
| 2010/0315786 A1 | 12/2010 | Ochi |
| 2011/0081750 A1* | 4/2011 | Machida ............. H01L 21/4842 438/123 |
| 2011/0180942 A1 | 7/2011 | Oikawa |
| 2011/0233759 A1* | 9/2011 | Shiga ................. H01L 23/4952 257/735 |
| 2012/0181706 A1 | 7/2012 | Zeng |

* cited by examiner

SEMICONDUCTOR DEVICE WITH STACKED TERMINALS

CROSS-REFERENCE TO RELATED APPLICATION

The present U.S. Utility Patent Application claims priority pursuant to 35 U.S.C. § 120 as a continuation of U.S. Utility application Ser. No. 15/274,734, entitled "SEMICONDUCTOR DEVICE WITH STACKED TERMINALS," filed Sep. 23, 2016, which claims priority pursuant to U.S.C. § 119(e) to U.S. Provisional Application No. 62/233,178, entitled "SEMICONDUCTOR DEVICE WITH STACKED TERMINALS", filed Sep. 25, 2015, both of which are hereby incorporated herein by reference in their entirety and made part of the present U.S. Utility Patent Application for all purposes.

BACKGROUND

Many traditional semiconductor devices have essentially similar shapes: a housing with thin leads extending from it. The housing can be in form of a solid rectangle that serves to enclose and protect the circuitry on the inside. Protruding through the housing are the leads which are used to electrically connect the device to other components or circuits. For example, this form factor is used for some types of insulated-gate bipolar transistor (IGBT).

Because semiconductor devices are used for controlling electric current, their efficiency in doing so play an important role in the efficiency of the overall apparatus where they are being used. For instance, the performance and efficiency of a power inverter—a converter of direct current (DC) to alternating current (AC)—depends on the efficiency of the semiconductors devices in its circuits. The efficiency of the apparatus, in turn, can affect the performance of some larger system. For example, in an electric vehicle (e.g., a plug-in electric vehicle or a hybrid vehicle) the range of travel by electric power before one has to recharge the battery is an important characteristic. Therefore, an improved semiconductor device can improve the performance and efficiency of electric vehicles and other systems.

DETAILED DESCRIPTION

Figure 1:
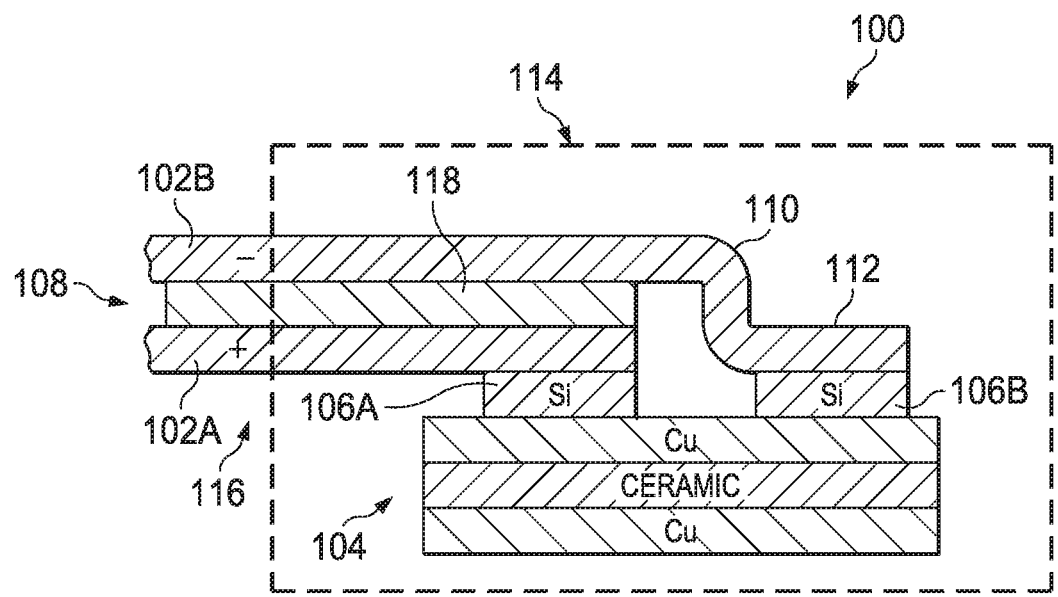
FIG. 1 shows a cross section of an example of a semiconductor device having stacked planar terminals.

This document describes examples of systems and techniques relating to improved semiconductor devices. In some implementations, a semiconductor device has relatively large and planar high-voltage terminals and/or busbars that are stacked on top of each other. These planar terminals/busbars and their arrangement with regard to the device as a whole can allow more efficient semiconductor operation and provide a convenient manufacturing process. For example, some parts of systems that are traditionally arranged around the device can instead be integrated into the same package as the device. This can improve the device's electrical and thermal performance, reduce its inductance, and lower the manufacturing and assembly costs.

Some implementations feature a co-pack design where one die (e.g., an IGBT and a diode) is included in a separate housing to form an individual device. Such devices can then be paired with each other to form the intended circuit, for example an inverter or other power electronics component. This can reduce the number of manufacturing steps, for example so that sintering is only performed on top and bottom sides of the co-pack with two step sintering. This can significantly simplify the manufacturing process and improve the yield rate. As another example, reliability validation testing can be simplified.

Some examples herein mention IGBTs or power inverters. This is for illustrative purposes only and other implementations include transistors other than an IGBT and/or an apparatus other than an inverter.

In a conventional IGBT, the module essentially consists of a substrate with four semiconductor circuits (also referred to as silicon dies) positioned in a generally rectangular arrangement on its surface. The module then has two busbars soldered to the silicon dies so that they extend away from the module. That is, each of the busbars is positioned on top of two of the silicon dies so that one busbar end is on the substrate and the other end extends beyond the edge of the substrate. These busbars are usually parallel to each other and spaced apart some distance that essentially corresponds to the positioning of the silicon dies on the substrate. In operation, current flows into the semiconductor device through one of the busbars, passes through the silicon dies, and flows out of the device through the other busbar.

One of the electrical characteristics that negatively affect semiconductor device performance is its inductance. It is therefore desirable to lower the inductance of a device without diminishing its ability to conduct and convert current. In the IGBT describe above, the inductance is proportional to the area between the busbars. Looking at the IGBT at a higher level, the individual silicon dies are connected to each other by bond wires that also connect them to one or more of the three leads extending from the housing. The bond wires often loop up in between two silicon dies, or between a die and the lead. In that context, the inductance is proportional to the area under the loop of the bond wire. As such, the efficiency of the semiconductor device can be improved by reducing the area between busbars or the area under bond wire loops.

FIG. 1 shows a cross section of an example of a semiconductor device 100 having stacked planar terminals 102A-B. The device is implemented using a substrate 104. The substrate can serve to direct heat away from the device while electrically insulating high-voltage components. In some implementations, the substrate includes a direct bonded copper (DBC) structure. For example, the DBC structure can include a ceramic layer sandwiched between copper layers as illustrated.

Semiconductor circuits are implemented on top of the substrate. Here, silicon dies 106A-B are shown. These silicon dies contain the circuitry that defines the particular mode(s) of operation of the overall semiconductor assembly. In some implementations, the silicon dies define an IGBT device. For example, the silicon dies can be manufactured as chips (sometimes referred to as silicon chips) that are then mounted onto the top surface of the substrate.

In this example, the semiconductor device has the stacked planar terminals 102A-B that abut the silicon dies 106A-B, respectively. The stacked planar terminals have an arbitrary length extending toward the left in the figure. Each of the terminals forms a complete plane, can be made of any conductive material, and can be soldered to its respective silicon die(s). The planar terminal 102A here abuts the silicon die 106A and is labeled positive (+) for reference. The planar terminal 102B here abuts the silicon die 106B and is labeled negative (−) for reference. That is, the terminals are stacked on top of each other and in this example the negative terminal overlaps the positive one. A separation 108 is here formed between the planar terminals.

Particularly, because the silicon dies 106A-B are in a common plane (on top of the substrate) the planar terminal 102B has an offsetting portion 110 along the entire width of the plane so as to provide a contact portion 112 that abuts the silicon die 106B. In some implementations, the contact portion forms a plane that is parallel to, and offset from, the plane of the main portion of the planar terminal 102B. The offsetting portion can be formed using any suitable technique, such as by stamping or bending.

A housing 114 encloses at least part of the semiconductor device. The housing can have one or more openings. In some implementations, the housing has a common opening 116 through which the planar terminals 102A-B extend. For example, after the substrate, the silicon dies and the planar terminals are assembled, the housing can be over molded on that assembly so that the terminals extend from the enclosed structure.

An electric insulator 118 can be provided in the separation between the planar terminals. The insulator provides electric insulation across the entire width of the conductive sheets that form the respective planar terminals. In some implementations insulating paper is used.

That is, the above describes an example of a semiconductor device 100 that includes a housing 114, a substrate 104 inside the housing, semiconductor circuits 106A-B on the substrate, and planar terminals 102A-B that extend away from the housing and are electrically connected to the first and second semiconductor circuits, respectively. In particular, the planar terminals are stacked on top of each other.

As a result, the inductance is now proportional to the area between the planar terminals 102A-B plus the area between the terminal 102B and the substrate 104 where the negative terminal overlaps the positive one. This can allow for a significant reduction of inductance compared to traditional device designs. For example, because the planar terminals abut the silicon dies and also extend outside the housing, the busbar structure can be considered (at least partially) integrated within the housing. Some of the present implementations can avoid attaching IGBT leads to an external busbar layer and thereby eliminate the need to form holes in such busbar layer, which could otherwise increase the inductance.

Figure 2:
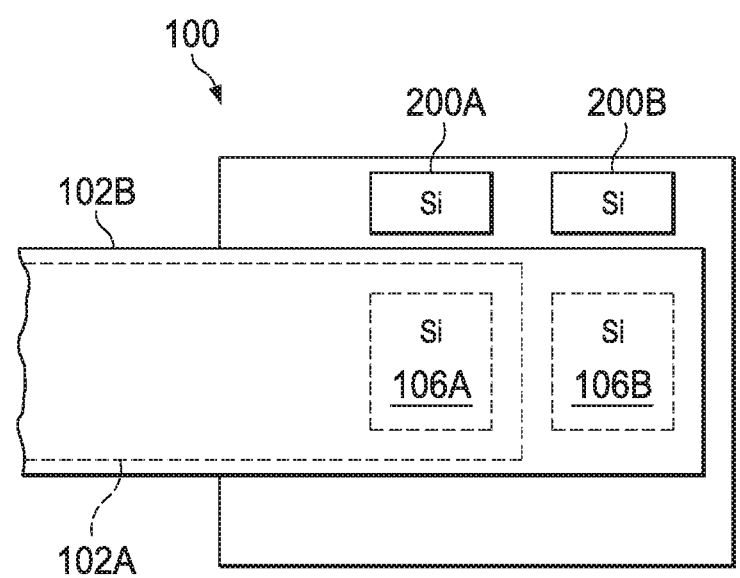
FIG. 2 shows a top view of the semiconductor device in FIG. 1.

FIG. 2 shows a top view of the semiconductor device 100 in FIG. 1. This illustrates how the planar terminal 102A abuts the silicon die 106A and the planar terminal 102B abuts the silicon die 106B. Because the planar terminals are stacked on top of each other and one of them partially overlaps the other, the terminal 102A and the dies 106A-B are shown in phantom. The terminal 102A is here shown as narrower that the terminal 102B only to clarify the illustration. This arrangement provides an increased busbar width per die area which improves performance. In some implementations, the planar terminals overlap each other for most of their respective surface areas. Also shown are additional semiconductor circuits. In some implementations, these include further silicon dies 200A-B that are also part of the semiconductor device. The planar terminals are attached to the respective silicon die(s) 106A-B and 200A-B by any suitable technique, including, but not limited to, soldering.

Figure 3:
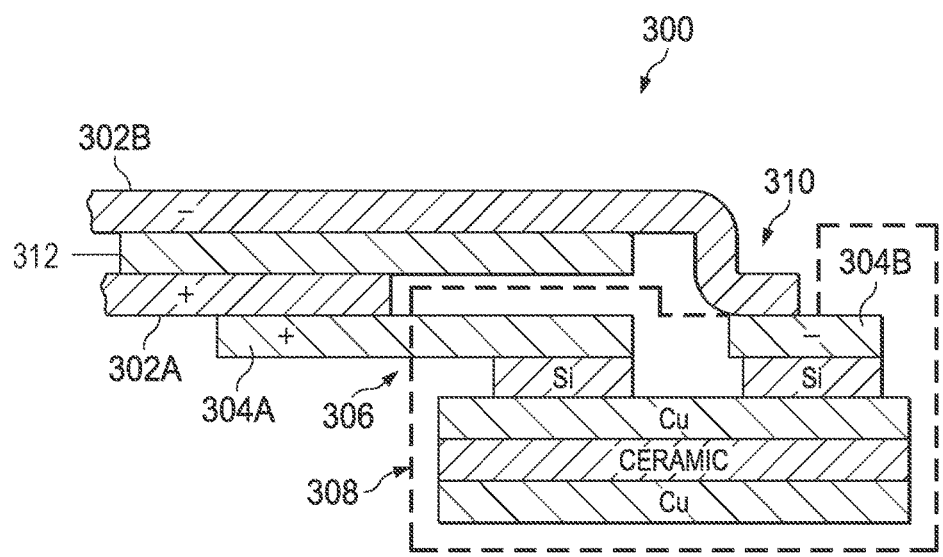
FIG. 3 shows a cross section of another example of a semiconductor device having stacked planar terminals.

FIG. 3 shows a cross section of another example of a semiconductor device 300 having stacked planar terminals 302A-B. The silicon dies and the substrate can be essentially the same as above. However, busbars 304A-B that abut the respective silicon dies here extend in a common plane, not stacked on top of each other. The busbars 304A-B can be essentially planar conductors that provide high voltage connection to the silicon dies. Some or all of the busbar 304A is exposed to the outside through an opening 306 in a housing 308 that encloses at least part of the semiconductor device. Also, some or all of the busbar 304B is exposed to the outside through an opening 310 in the housing. For example, the openings can be formed as part of an overmolding process that encapsulates the device into an enclosed structure.

Here, the planar terminal 302A abuts the busbar 304A outside the housing. Also, the planar terminal 302B abuts the busbar 304B, at least the part thereof that is exposed through the opening 310. For example, the planar terminal and the busbar can be welded together. In some implementations, this approach can lead to a simplified manufacturing process in that the planar terminals—which can be sheets wide enough to span several IGBTs—can easily be aligned with and attached to the busbars of the device(s). In some implementations, both of the busbars can be exposed through holes in a similar way as shown for the busbar 304B.

Similar to the previous example, the planar terminal 302B can have an offsetting portion that provides a contact portion—parallel with and offset from the main portion of the planar terminal—so as to reach at least a portion of its busbar.

Electric insulation 312 can be provided in the separation between the planar terminals 302A-B. In some implementations, the stacked structure of these planar terminals (with insulation) can be assembled in advance and then this assembly can be brought to the rest of the semiconductor device for making the electrical connections. As such, the current example can be considered as having the stacking done outside the semiconductor package instead of inside it which can simplify the manufacture.

Figure 4:
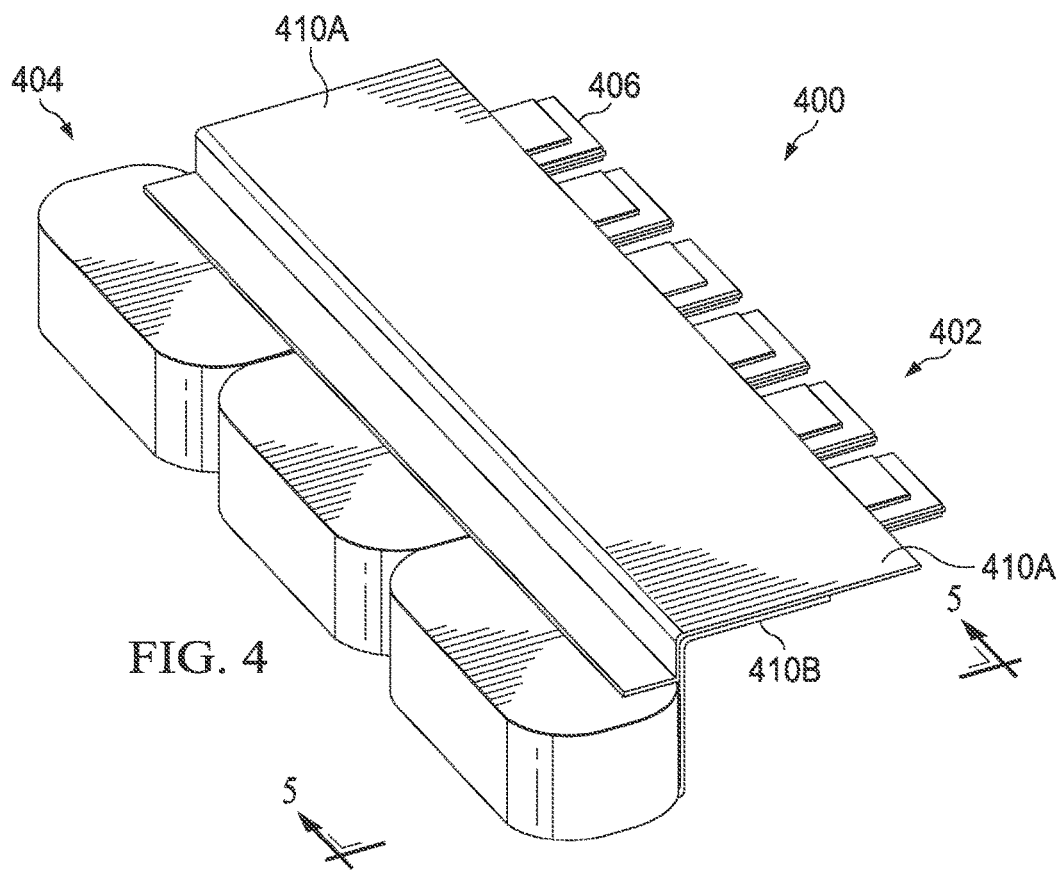
FIG. 4 shows a perspective view of an assembly of semiconductor devices and capacitors.
Figure 5:
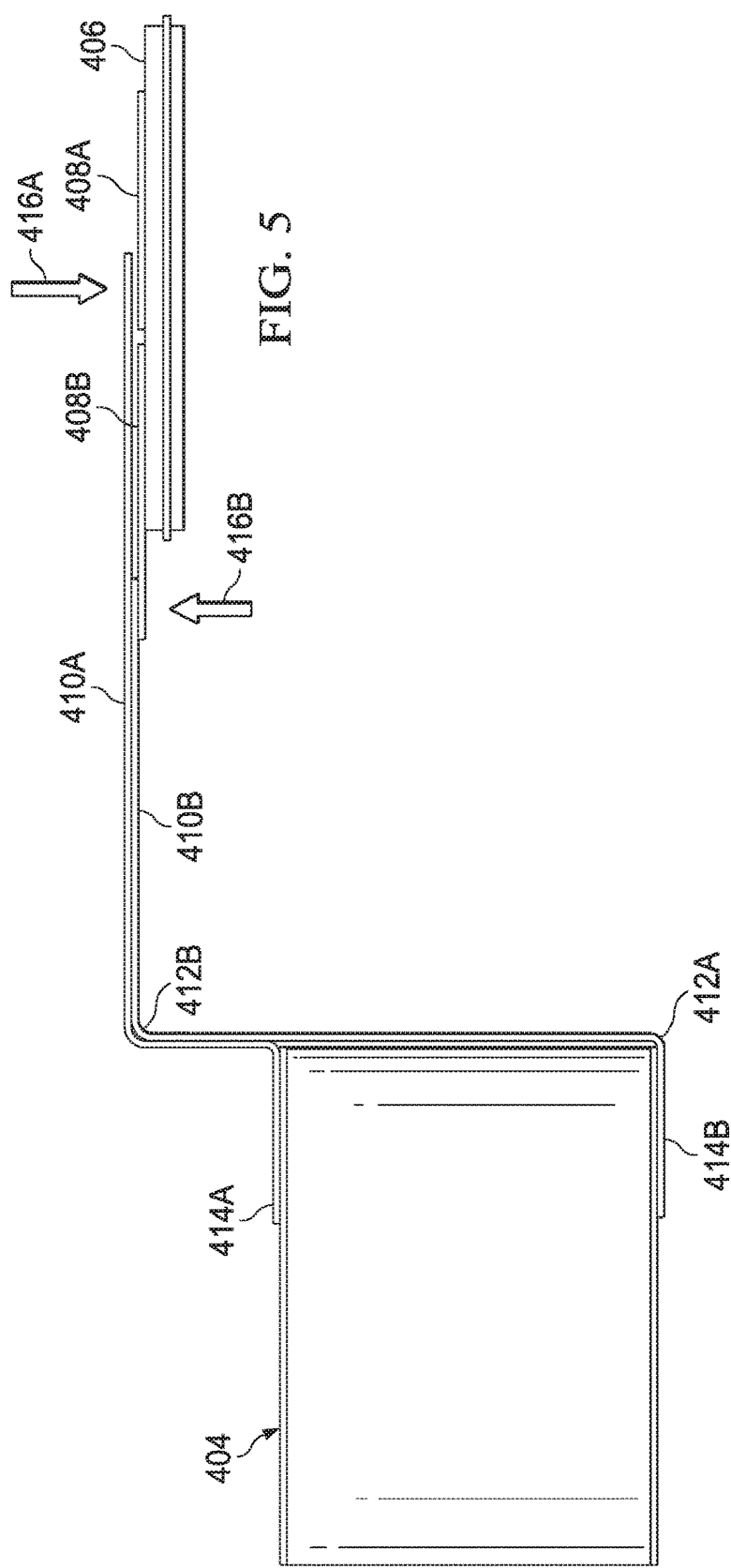
FIG. 5 shows a cross section of the assembly in FIG. 4.

FIG. 4 shows a perspective view of an assembly 400 of semiconductor devices 402 and capacitors 404. FIG. 5 shows a cross section of the assembly in FIG. 4. In some implementations, capacitors are coupled to the semiconductor devices in order to protect against transients, and to help maintain a voltage on a DC bus. For example, the capacitors can serve as DC link capacitors. Any form of capacitor conductors can be used, including, but not limited to, films or foils (e.g., folded or rolled into a compact structure).

Here, a set of six semiconductor devices 402 are shown but in other implementations more or fewer can be used. The semiconductor housings are here omitted for clarity. The semiconductor devices are arranged next to each other in a row. Each device has a substrate 406 and busbars 408A-B. The busbars are connected to respective semiconductor circuits on the substrates (e.g., silicon dies) which are not visible in this illustration. In particular, the silicon dies would be positioned between the respective busbars 408A-B and the substrate 406.

Planar terminals 410A-B are here comprised of conductive sheets that connect the capacitors 404 to each of the semiconductor devices via the busbars. The planar terminals are stacked on top of each other so that the planar terminal 410A abuts the busbar 408A and the planar terminal 410B abuts the busbar 408B. At the other end of the planar terminals, they connect to respective conductors of the capacitors. That is, each planar terminal connects multiple semiconductor devices to each of the several capacitors. FIG. 4 also illustrates that the busbars can have a significant width compared to the semiconductor device as a whole (essentially the substrate width). For example, each of the busbars can be at least 70% of the width of the semiconductor device.

One or more of the planar terminals 410A-B can have a step shape when viewed in profile. Here, the planar terminals are essentially flat planes in the area near the semiconductor devices. To accommodate the relative position of the capacitors and the semiconductor devices, the planar terminal 410B (the "lower" of the terminals in this example) makes turns 412A-B so as to provide a contact plane 414B for (in this example) the bottom conductor of the capacitor. The planar terminal 410A can make corresponding turns to form a contact plane 414A for the opposite capacitor conductor.

The planar terminals provide a continuous conductive plane for current traveling to and from the capacitors. That is, because there are no holes in these sheets or pins at their edge where they electrically connect to the semiconductor devices, there are fewer or no "necks" that impede the flow of current.

The assembly 400 can form part of a power inverter. In some implementations, the inverter can include two (or more) of the assembly 400 where the semiconductor devices (e.g., IGBTs) are jointly controlled so as to perform the DC-to-AC conversion. For example, two such assemblies can be oriented so that their respective semiconductor devices are near each other, which can simplify the placement and operation of cooling systems (e.g., liquid-based heatsinks).

An example of assembling an apparatus will now be described. This description will refer to some examples of components mentioned above for illustrative purposes. However, other components can be used instead of or in addition to these.

Semiconductor devices (e.g., 402) are positioned in a row. Each of the semiconductor devices comprises a substrate (e.g., 406), first and second semiconductor circuits (e.g., 106A-B) on the substrate, and first and second busbars (e.g., 408A-B) abutting the first and second semiconductor circuits, respectively.

An assembly is formed by placing a first planar terminal (e.g., 410A) in contact with the first busbar (e.g., 408A) of each of the plurality of semiconductor devices, and a second planar terminal (e.g., 410B) in contact with the second busbar (e.g., 408B) of each of the plurality of semiconductor devices. The first and second planar terminals are stacked on top of each other. For example, the terminals can first be stacked and then (as an assembled stack) be placed in contact with the respective busbars.

The first planar terminal is welded to the first busbar of each of the plurality of semiconductor devices. Such welding can be performed from one side of the assembly. A weld 416A from above the assembly is here schematically illustrated. Similarly, the second planar terminal is welded to the second busbar of each of the plurality of semiconductor devices. Such welding can be performed from the opposite side of the assembly. A weld 416B from below the assembly is here schematically illustrated. For example, laser welding can be used.

An electrical insulation layer (e.g., 118) can be included between the first and second planar terminals. For example, an insulating paper can be inserted before the terminals are stacked on top of each other.

Each of the first and second planar terminals can be electrically connected to a plurality of capacitors (e.g., 404). For example, respective contact planes of the terminals can be connected (e.g., welded) to respective capacitor terminals.

More or fewer steps can be performed in some assembly processes. Also, two or more steps can be performed in a different order.

Figure 6:
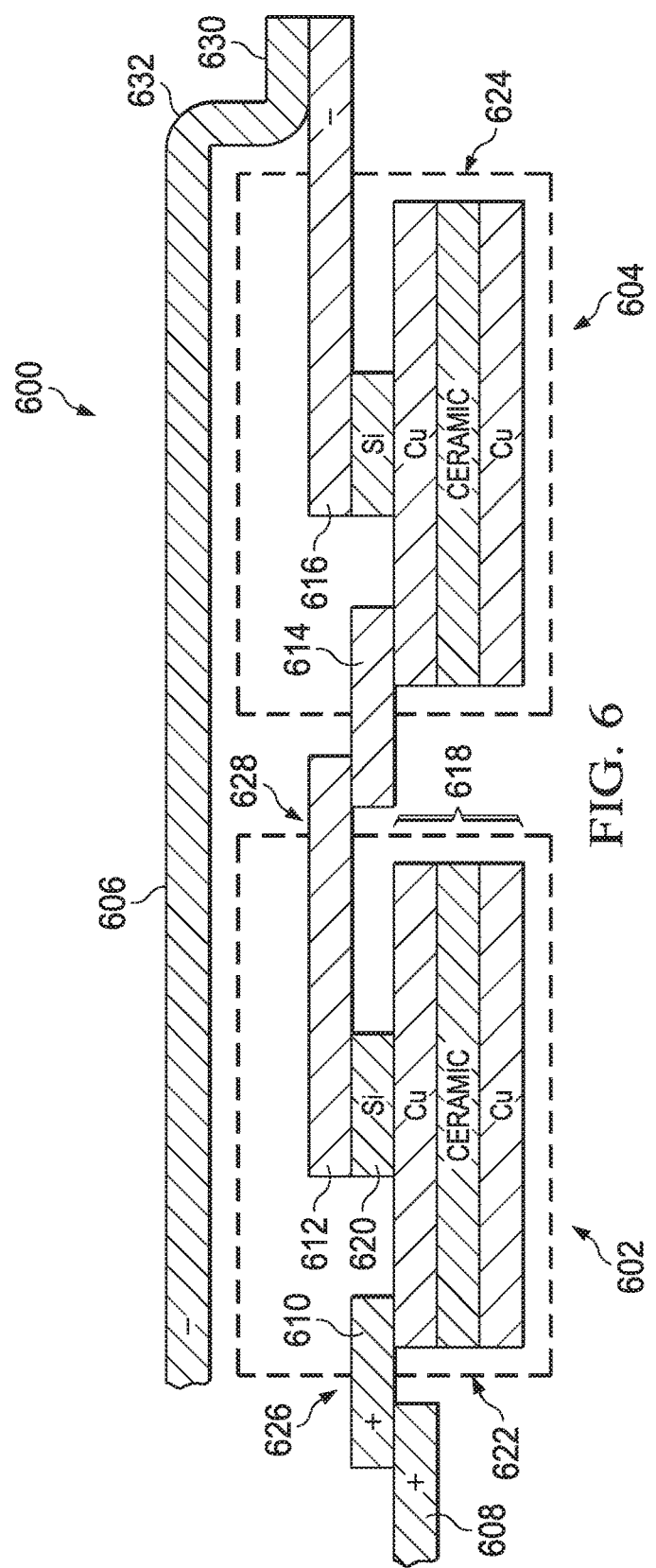
FIG. 6 shows another example of a semiconductor assembly configured to have stacked terminals.

FIG. 6 shows another example of a semiconductor assembly 600 configured to have stacked terminals. This example uses a co-pack design where a pair of individual devices 602 and 604 make use of terminals 606 and 608 that are planar and stacked. The semiconductor devices can also have planar busbars. Here, the device 602 has busbars 610 and 612, and the device 604 has busbars 614 and 616. The shown polarities (+ and −) are for illustrative purposes only. These busbars facilitate positioning of the terminals 606 and 608 in a stacked fashion, as well as can simplify the assembly technique.

Each device has a substrate 618 on which a corresponding silicon die 620 is positioned. The substrate and/or the die can be similar or identical to those described elsewhere herein. In some implementations that have a co-pack design, the die 620 can include both one or more switching devices (e.g., an IGBT) and one or more other semiconductor devices (e.g., a diode). For example, the assembly 600—which includes the two devices 602 and 604—can then be used in one of the half bridges in a power inverter.

The busbars 612 and 616 are here positioned on top of the corresponding silicon die and are electrically connected to it. The other busbars 610 and 614 are also electrically connected, for example by one or more wire bonds (not shown) to the die. The busbars for the individual device (e.g., busbars 610 and 612) can be configured so that they facilitate good performance characteristics (e.g., reduced inductance) and a simplified assembly process. These busbars can be positioned in opposite directions from the silicon die. In some implementations, one of the planar busbars can extend in a plane that is parallel to and offset from the plane of the other busbar. For example, here the busbar 612 sits higher above the substrate than the busbar 610 so that there is an offset between them. In other implementations, the busbars can be located in a common plane.

The devices 602 and 604 are enclosed in respective housings 622 and 624. One advantage of a co-pack design can be that the individual die within its housing is easy to handle and install. For example, the busbar geometries of the respective individual devices can facilitate direct connection between the devices, and with other components such as terminals.

The planar busbars can extend from the respective housing in essentially opposing directions. Here, for example, the busbar 610 has an opening 626 that allows connection with the terminal 608. The busbar 612 has an opening 628 that allows connection with the busbar 614 from the device 604. The attachment between the busbar 616 and the terminal 606 can be facilitated by a contact portion 630 that is offset from a main part of the terminal 606 by an offsetting portion 632. For example, this can facilitate a close spacing (here in a vertical direction) between the terminal 606 and the busbar 616, which can help avoid significant inductance.

The assembly 600 can be used in any or all contexts described above. Some examples will be provided. With reference again to FIG. 4, the capacitors 404 shown there can be connected to the assembly 600. In some implementations, the planar terminal 410A can serve as the terminal 606, and/or the planar terminal 410B can serve as the terminal 608. For example, this can allow advantageous simplified connection to the semiconductor devices, while allowing the terminals to be planar and have relatively large surface areas.

The assembly 600 can be assembled using any or all approaches described above. First, in some implementations, the busbars 612 and 614 are attached to each other before the terminals (e.g., 606, 608) are put in place. Any suitable joining technique can be used, including, but not limited to, laser welding, ultrasonic welding, sintering or soldering.

Second, the planar terminals 606 and 608 can be attached to the respective devices 602 and 604 in analogy with examples described herein. With reference to FIG. 5, the planar terminal 410A shown there can serve as the terminal 606, and/or the planar terminal 410B shown there can serve as the terminal 608. This can simplify the stage of creating connections to/from the devices. In some implementations, the weld 416A can be applied to create attachment between the terminal 606 and the busbar 616. For example, the weld is applied from above the terminal 606. In some implementations, the weld 416B can be applied to create attachment between the terminal 608 and the busbar 610. For example, the weld is applied from below the terminal 608. This can provide an efficient manufacturing process where sintering (as an example of a joining technique) need only be performed on a top and bottom of an individual co-packed device. For example, two-step sintering can be used.

That is, the above exemplifies a manufacturing process where a first semiconductor device can be positioned near a second semiconductor device, the first semiconductor device having first and second planar busbars parallel to each other and extending in opposite directions through respective openings in a first housing. The second semiconductor device can have third and fourth planar busbars parallel to each other and extending in opposite directions through respective openings in a second housing. The second planar busbar of the first semiconductor device can be attached to the third planar busbar of the second semiconductor device. A first planar terminal can be positioned adjacent the first planar busbar of the first semiconductor device, and a second planar terminal can be positioned adjacent the fourth planar busbar of the second semiconductor device. The first planar terminal can be attached to the first planar busbar, and the second planar terminal can be attached to the fourth planar busbar.

A number of implementations have been described as examples. Nevertheless, other implementations are covered by the following claims.

What is claimed is:

1. A semiconductor device comprising:
   a housing;
   a substrate within the housing;
   a first semiconductor die mounted on the substrate within the housing;
   a first busbar having a first end coupled to the first semiconductor die and a second end extending from the housing;
   a second semiconductor die mounted on the substrate within the housing;
   a second busbar having a first side coupled to the second semiconductor die and a second side at least partially exposed at a surface of the housing;
   a first terminal outside the housing in a first terminal plane having:
      a first portion connected to the first busbar; and
      a second portion; and
   a second terminal outside the housing and having:
      a contact portion in a contact portion plane connected to the second side of the second busbar;
      a main portion in a main portion plane that is substantially parallel to the first terminal plane and that is substantially parallel to and offset from the contact portion plane; and
      an offsetting portion that connects the contact portion to the main portion,
   wherein the second portion of the first terminal substantially overlaps the main portion of the second terminal and wherein the second portion of the first terminal and the main portion of the second terminal reside on a same side of the housing.

2. The semiconductor device of claim 1, wherein the first terminal plane and the contact portion plane are substantially co-planar.

3. The semiconductor device of claim 1, further comprising an electric insulator sandwiched between the first terminal and the main portion of the second terminal.

4. The semiconductor device of claim 3, wherein the main portion of the second terminal is stacked above the first terminal.

5. The semiconductor device of claim 4, wherein the electric insulator extends beyond an end of the first terminal adjacent the housing.

6. The semiconductor device of claim 1, wherein the substrate comprises a metal, ceramic, metal sandwich.

7. The semiconductor device of claim 1, wherein the first busbar and the second busbar are substantially co-planar.

8. The semiconductor device of claim 1, wherein:
   the first semiconductor die includes at least one insulated-gate bipolar transistor (IGBT); and
   the second semiconductor die includes at least one IGBT.

9. The semiconductor device of claim 1, wherein:
   the first busbar is soldered to the first semiconductor die; and
   the second busbar is soldered to the second semiconductor die.

10. The semiconductor device of claim 1, wherein:
    the first terminal is soldered to the first busbar; and
    the second terminal is soldered to the second busbar.

11. The semiconductor device of claim 1, wherein the housing is an over molded housing.

* * * * *